United States Patent
Hsu et al.

(10) Patent No.: US 7,112,837 B2
(45) Date of Patent: Sep. 26, 2006

(54) MFIS FERROELECTRIC MEMORY ARRAY

(75) Inventors: Sheng Teng Hsu, Camas, WA (US);
Fengyan Zhang, Vancouver, WA (US);
Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/262,545

(22) Filed: Oct. 28, 2005

(65) Prior Publication Data

US 2006/0068509 A1 Mar. 30, 2006

Related U.S. Application Data

(62) Division of application No. 10/953,912, filed on Sep. 28, 2004, now Pat. No. 6,991,942.

(51) Int. Cl.
*H01L 29/76* (2006.01)
(52) U.S. Cl. .................... 257/295; 257/347
(58) Field of Classification Search ........... 257/295, 257/347; 438/3, 151–166
See application file for complete search history.

(56) References Cited

U.S. PATENT DOCUMENTS 6,531,324 B1 * 3/2003 Hsu et al. .................. 438/3
6,711,049 B1 * 3/2004 Hsu et al. .................. 365/145

* cited by examiner

*Primary Examiner*—Richard A. Booth
(74) *Attorney, Agent, or Firm*—Law Office of Gerald Maliszewski; Gerald Maliszewski

(57) ABSTRACT

An MFIS memory array having a plurality of MFIS memory transistors with a word line connecting a plurality of MFIS memory transistor gates, wherein all MFIS memory transistors connected to a common word line have a common source, each transistor drain serves as a bit output, and all MFIS channels along a word line are separated by a P+ region and are further joined to a P+ substrate region on an SOI substrate by a P+ region is provided. Also provided are methods of making an MFIS memory array on an SOI substrate; methods of performing a block erase of one or more word lines, and methods of selectively programming a bit.

5 Claims, 6 Drawing Sheets

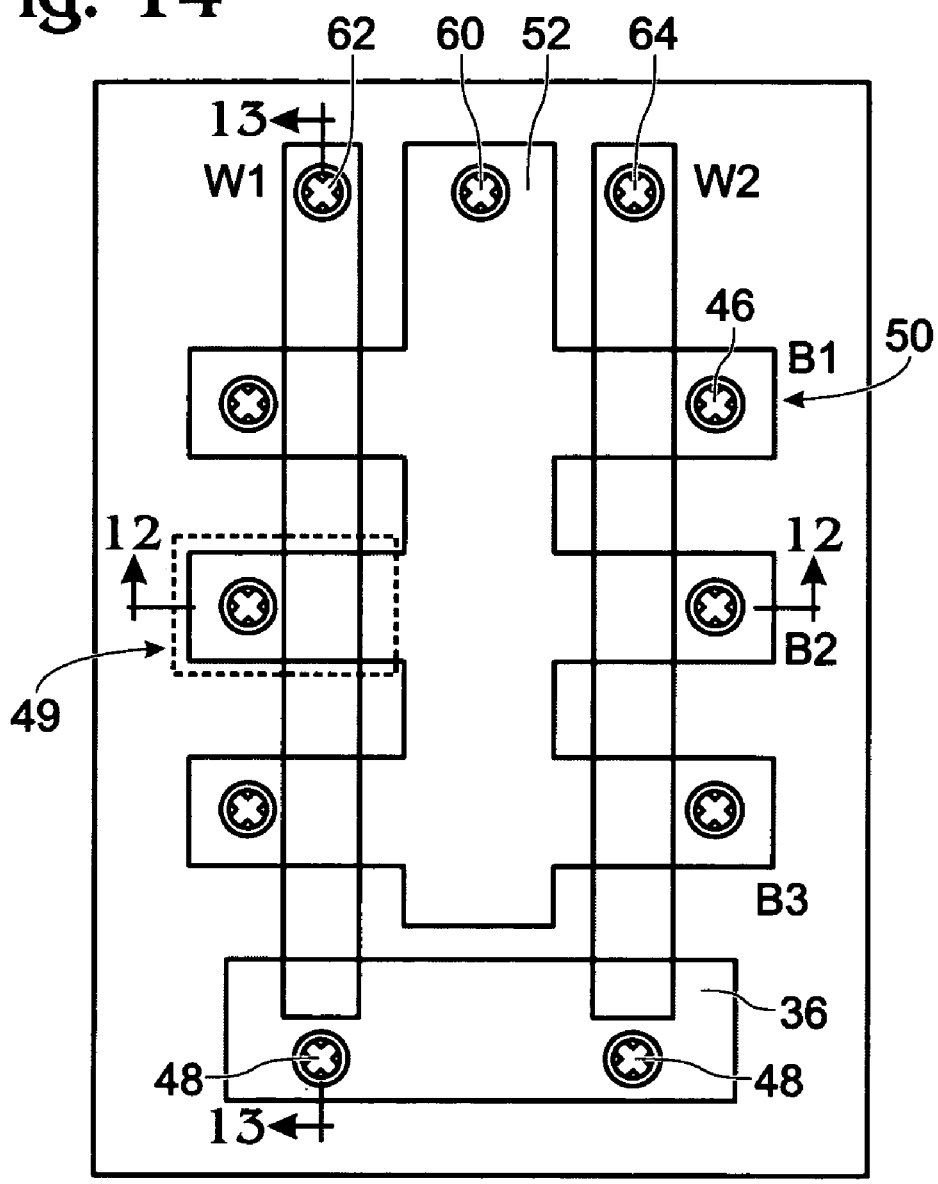

MFIS FERROELECTRIC MEMORY ARRAY

RELATED APPLICATIONS

This application is a Divisional of a patent application entitled, MFIS FERROELECTRIC MEMORY ARRAY ON SOI AND METHOD OF MAKING SAME, invented by Hsu et al., Ser. No. 10/953,912, filed Sep. 28, 2004 now U.S. Pat. No. 6,991,942.

BACKGROUND OF THE INVENTION

The present device structures and methods of manufacture relate generally to semiconductor technology and more particularly to metal-ferroelectric-insulator-semiconductor (MFIS) transistor structures and methods of their fabrication. An MFIS transistor is similar to an MFOS transistor, in which the gate dielectric may be silicon oxide or other gate insulator, including high-k materials.

Previously single transistor ferroelectric memory arrays have been made on bulk silicon. Ferroelectric memory arrays on bulk silicon may be block erased by applying a bias to the substrate, or the p-well. This method of performing a block erase is not suitable to devices formed on thin, fully depleted, SOI devices, where the body bias is not reliable.

BRIEF DESCRIPTION OF THE DRAWINGS

FIG. 14 is top view of a MFIS ferroelectric memory array structure.

DETAILED DESCRIPTION OF THE INVENTION

A silicon on insulator (SOI) substrate is prepared. The silicon film is thinned to provide a structure suitable for full depletion operation of the resulting device. The thinning may be accomplished using thermal oxidation and oxide removal. An ion implant may be performed to adjust the threshold voltage of the resulting device. Using photoresist to selectively etch silicon from the field region of the control area, which will later include the non-memory transistors.

Once the SOI substrate is prepared, silicon dioxide is thermally grown to form a gate oxide layer. Alternatively, the silicon dioxide is deposited to form a gate oxide layer. A gate layer is then deposited overlying the gate oxide layer. The gate layer may comprise polysilicon, silicon germanium, or other suitable material as sacrificial gate for memory transistors and the final gate electrodes for the non-memory transistors. The gate layer may be doped as either N+ or P+. The gate layer may be formed to a thickness of between approximately 50 nm and 300 nm. A silicon dioxide hard mask layer is then deposited overlying the gate layer, followed by the deposition of a nitride hard mask layer overlying the silicon dioxide hard mask layer. Both the silicon dioxide hard mask layer and the nitride hard mask layer may be formed to a thickness of between approximately 20 nm and 50 nm. Although, silicon dioxide and nitride have been discussed as possible hard mask materials, other hard mask materials, which are suitable for selective etching, such as Ti, TiN, $Al_2O_3$, may also be used A layer of photoresist is then deposited and patterned to provide protection for the gate areas, which will correspond to the word lines in the memory array structure. The nitride hard mask is etched, leaving the nitride hard mask over the gate areas. The layer of photoresist is then removed.

Figure 1:
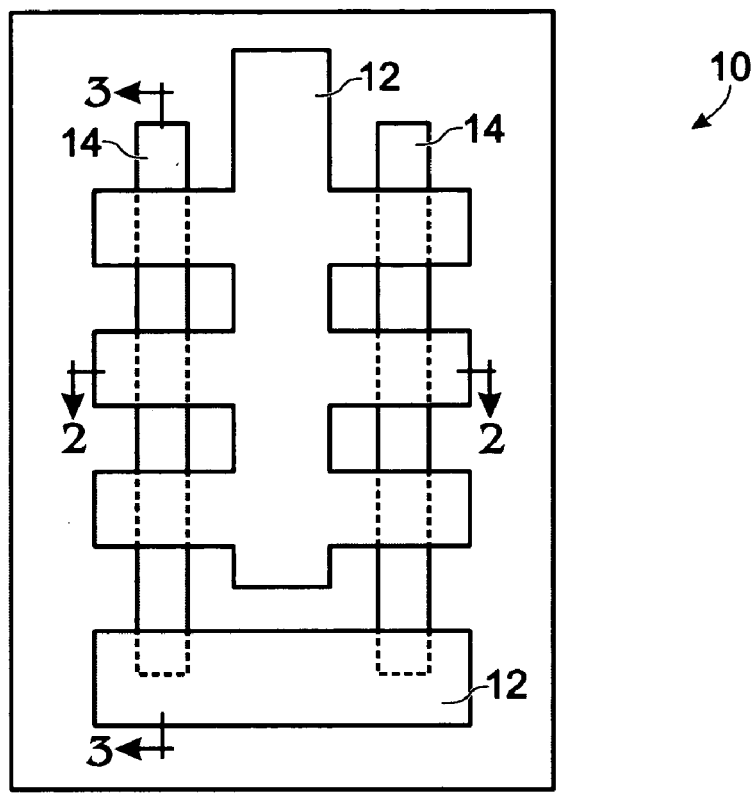
FIG. 1 is top view of an MFIS ferroelectric memory array structure during initial fabrication.

FIG. 1 shows a top view of an MFIS ferroelectric memory array structure 10 during initial fabrication. Another layer of photoresist 12 is deposited and patterned to provide protection for an active area. The nitride hard mask 14 is shown over the gate areas.

Figure 2:
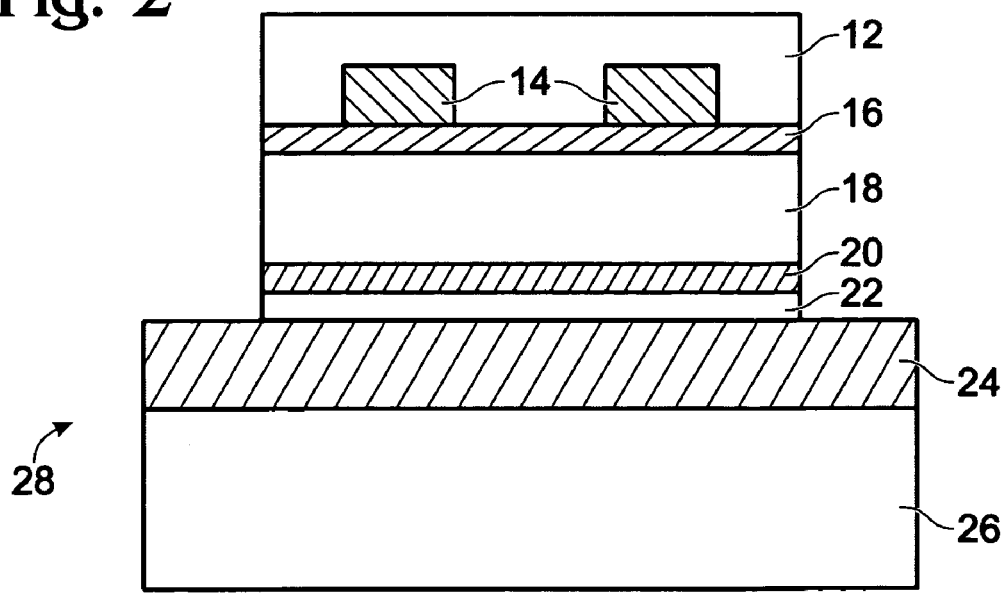
FIG. 2 is a cross-sectional view taken along 2—2 of FIG. 1.
Figure 3:
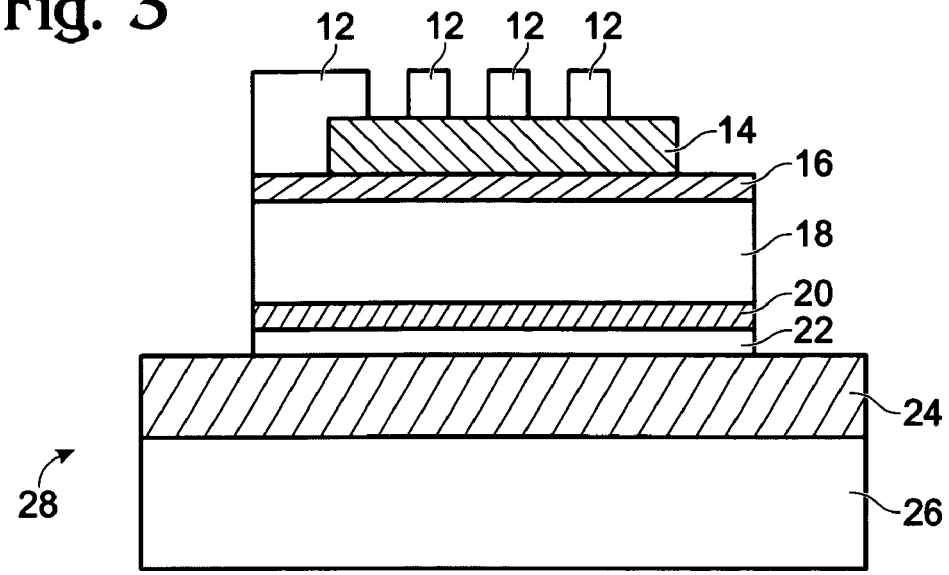
FIG. 3 is a cross-sectional view taken along 3—3 of FIG. 1.

Referring now to FIGS. 2 and 3. FIG. 2 is a cross-sectional view taken along 2—2 of FIG. 1, and FIG. 3 is a cross-sectional view taken along 3—3 of FIG. 1. Using the combination of the photoresist 12 and the nitride hard mask 14, etch through the silicon dioxide hard mask 16, the gate layer 18, the gate oxide layer 20, and the silicon film 22 of the SOI substrate, leaving an insulator 24 and the backing substrate 26, if any, from the SOI substrate 28. This etch step will produce isolated islands of active area SOI regions separated by regions of insulator 24 without overlying silicon film. The photoresist 12 should not be stripped at this point.

Figure 4:
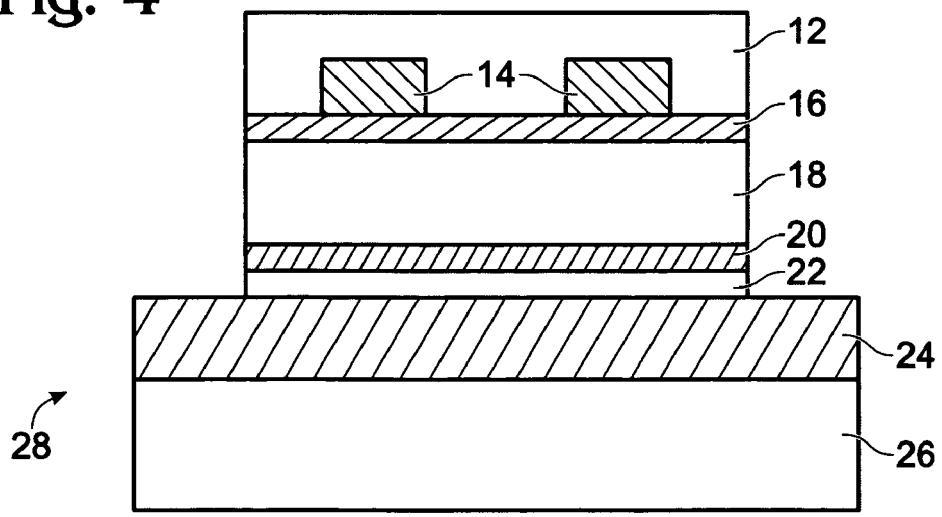
FIG. 4 is a cross-sectional view corresponding to FIG. 2 following additional processing.
Figure 5:
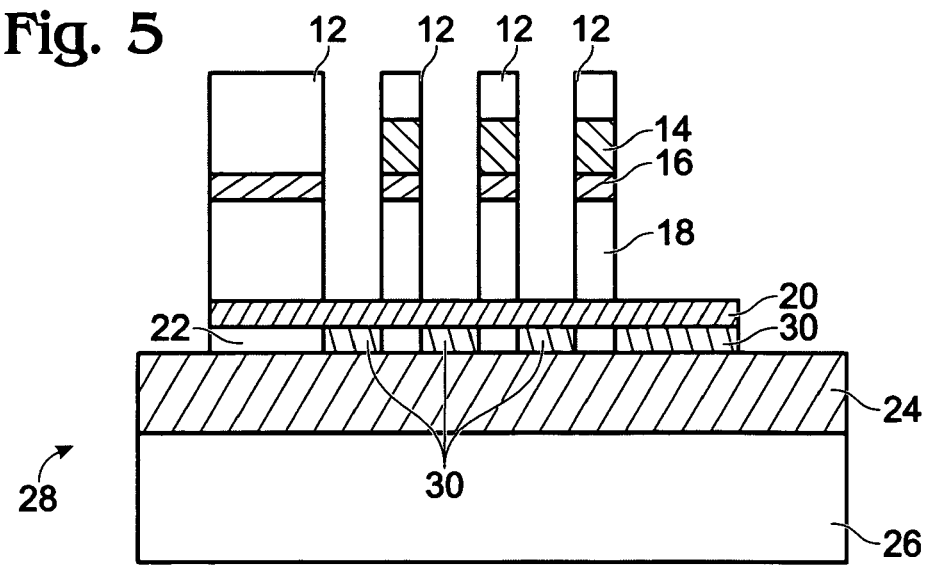
FIG. 5 a cross-sectional view corresponding to FIG. 3 following additional processing.

If the photoresist 12 remains intact, it will be used as the mask to etch through the nitride hard mask 14, the silicon oxide hard mask 16, and the gate layer 18, as shown in FIGS. 4 and 5. Any state-of-the-art P+ ion implantation is then used to dope the exposed portions of the silicon film 22 through the gate oxide layer 20 to form P+ regions 30. For example, a boron ion implantation at an energy of between approximately 1 keV and 10 keV and dose of $5\times10^{14}/cm^2$ to $5\times10^{15}/cm^2$ may be used for this ion implantation. The photoresist 12 should be stripped following the P+ implant. If the photoresist 12 was not sufficiently intact, it could be stripped and re-patterned. This may be less desirable as it does not provide as much self-alignment between etching steps.

Figure 6:
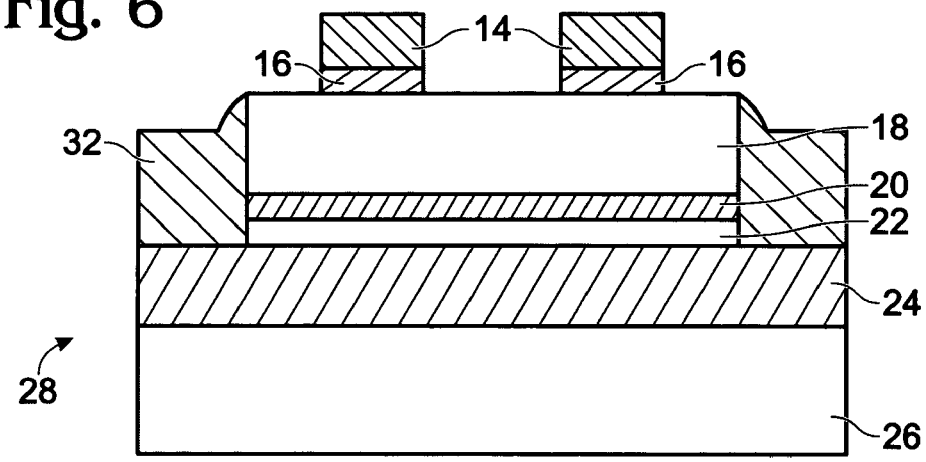
FIG. 6 a cross-sectional view corresponding to FIG. 4 following additional processing.
Figure 7:
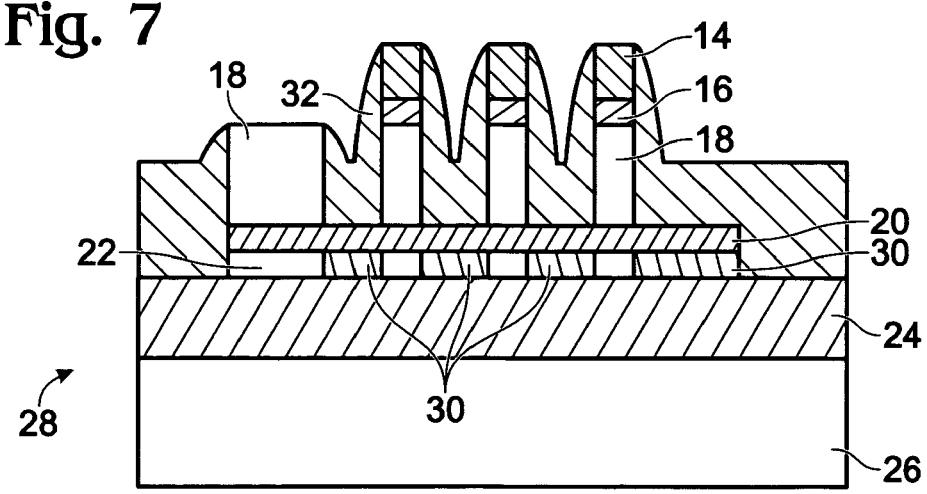
FIG. 7 a cross-sectional view corresponding to FIG. 5 following additional processing.

A layer of silicon dioxide 32 is then deposited, for example using CVD deposition. A partial etch back is then performed to remove silicon dioxide until nitride hard mask 14 is exposed. This etch back may be any dry etch process or CMP process or the combination of CMP followed by wet or dry etch process. This partial etch back will also expose the gate layer 18 where it is not covered by the nitride hard mask 14, as shown in FIGS. 6 and 7. The initial CVD deposition should be sufficiently thick that following the partial etch back a layer of silicon oxide between approximately 100 nm and 250 nm remains overlying the P+ regions 30.

Figure 8:
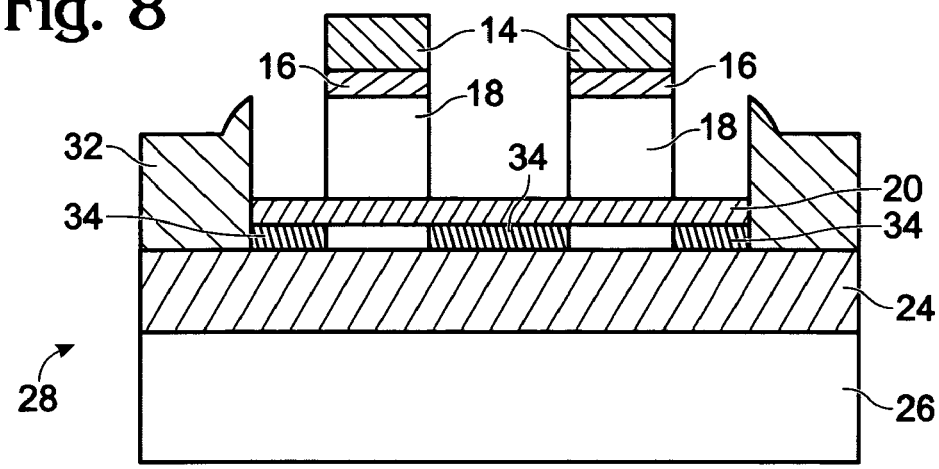
FIG. 8 a cross-sectional view corresponding to FIG. 6 following additional processing.
Figure 9:
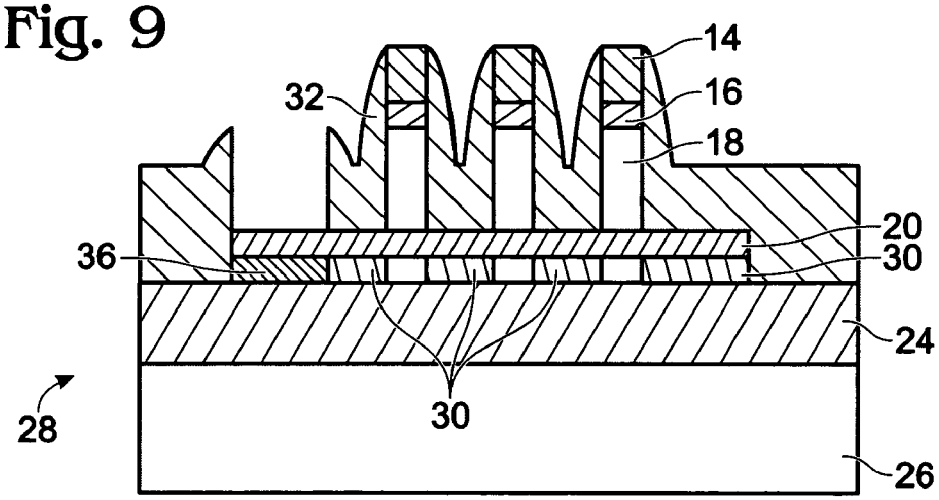
FIG. 9 a cross-sectional view corresponding to FIG. 7 following additional processing.

The exposed gate layer 18 is then etched using an anisotropic etch to remove it from regions not covered by the nitride hard mask 14, as shown in FIGS. 8 and 9. Two ion implants are then performed. One is an N+ source/drain ion implantation for forming the source/drain regions 34 and the other is a P+ implant for the substrate region 36. The sequence of these two implants is not critical, but each will require a mask step. One mask step to protect the areas outside the source/drain regions 36 during the N+ implant, and the other to protect the source/drain regions and other areas during the P+ substrate implant of the substrate region 36. The N+ region may be implanted using $5 \times 10^{14}/cm^2$ to $5 \times 10^{15}/cm^2$ of phosphorus ions or arsenic ions with an energy of between approximately 5 keV and 30 keV for phosphorous ions, or between approximately 10 keV and 60 keV for arsenic ions. The P+ ion implantation is $5 \times 10^{14}/cm^2$ to $5 \times 10^{15}/cm^2$ at between 1 keV and 10 keV for boron ions.

In an alternative embodiment, a raised source/drain structure (not shown) may be used. This can be accomplished by forming sidewalls, for example using oxide or nitride, and removing all oxide on the silicon film not covered by silicon oxide or a gate stack formed by the gate layer, the nitride hard mask and the silicon oxide hard mask. A selective epitaxial growth of between approximately 20 nm and 50 nm of silicon is then grown over the exposed silicon film. The P+ and N+ ion implantation of steps discussed above may then be performed to form the source/drain regions and the substrate region.

Figure 10:
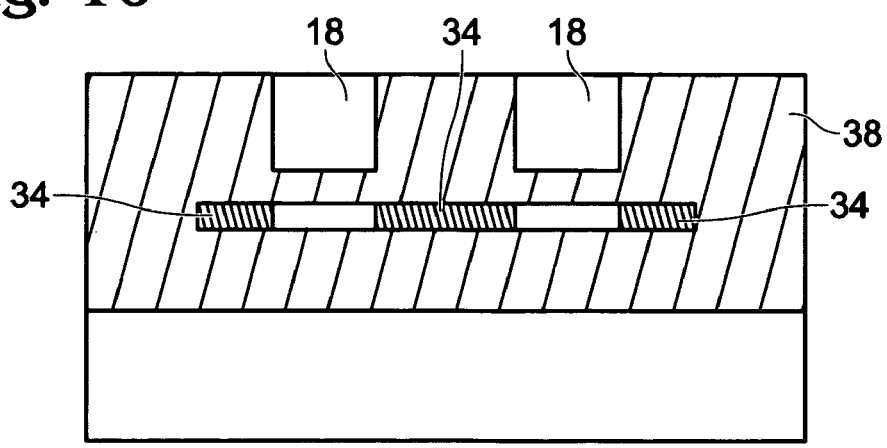
FIG. 10 a cross-sectional view corresponding to FIG. 8 following additional processing.
Figure 11:
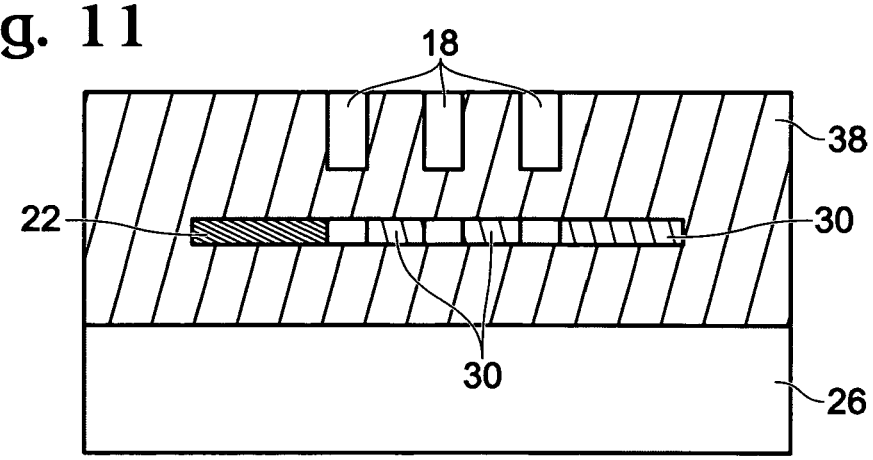
FIG. 11 a cross-sectional view corresponding to FIG. 9 following additional processing.

Another layer of oxide 38 is deposited to a thickness of between approximately 1.5 and 2.0 times higher than the distance from the top of the silicon film 22 to the top of the nitride hard mask 14. The layer of oxide 38 is then polished, for example using CMP, until the top of the gate layer 18 is exposed as shown in FIGS. 10 and 11.

Figure 12:
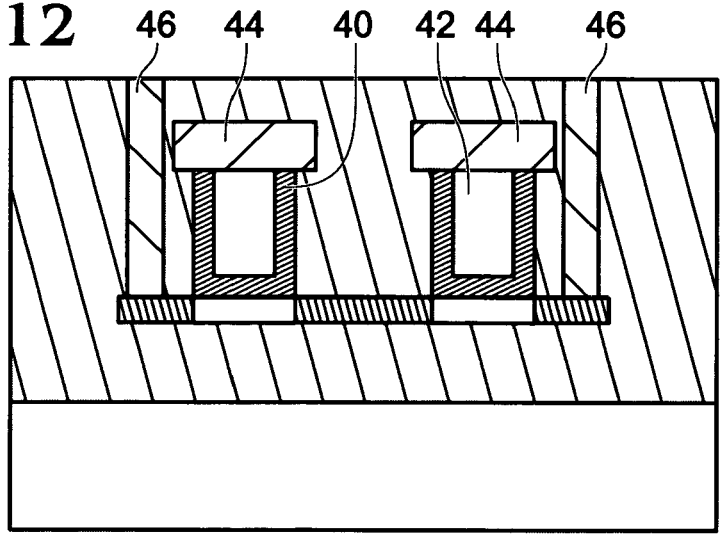
FIG. 12 a cross-sectional view corresponding to FIG. 10 following additional processing.
Figure 13:
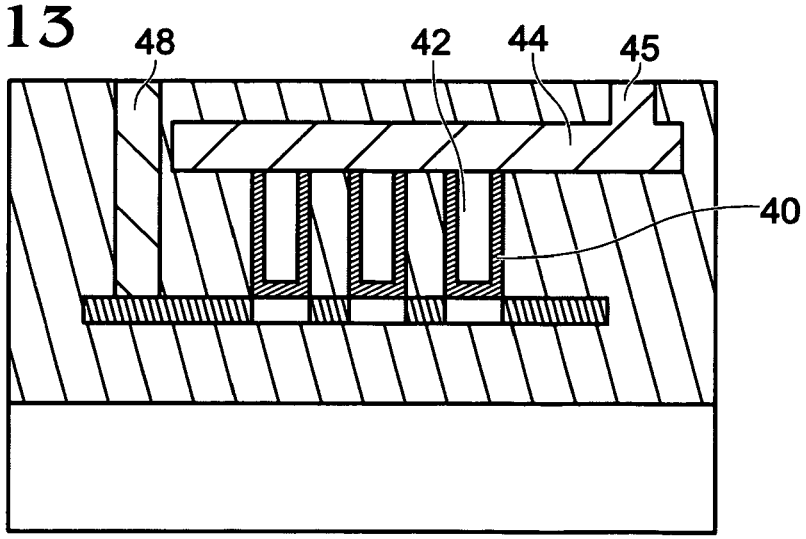
FIG. 13 a cross-sectional view corresponding to FIG. 11 following additional processing.

The remaining portions of the gate layer 18 are etched away along with the underlying regions of the gate oxide layer 20. A layer of high-k dielectric material 40, for example $HfO_2$, $ZrO_2$, $HfAlO_2$, $ZrAlO_2$, is deposited to a thickness of between approximately 3 nm and 50 nm, as shown in FIGS. 12 and 13. A ferroelectric material is then deposited and planarized, for example using CMP, stopping at, or just beyond, the high-k dielectric material 40 to form ferroelectric gates 42. The ferroelectric material may be PGO, PZT, SBT, SBO, SBTO, SBTN, STO, BTO, BLT, LNO or $YMnO_3$. Top electrodes 44, which may be Pt or Ir for example, are then formed to serve as word lines. A layer of silicon dioxide is then deposited and the first metallization is completed to provide contacts 45 to the top electrodes 44, the bit contacts 46 and the substrate contact 48.

FIG. 14 is top view of a MFIS ferroelectric memory array structure. The cross-sections 12—12 and 13—13 correspond to FIGS. 12 and 13 respectively. The embodiment of the MFIS ferroelectric memory array structure shown is a 2×3 memory array. Each memory transistor, shown at 49, has a drain 50 that serves as the bit output. Each drain 50 is isolated. The memory transistors along a given word line has a common source 52. As shown in this embodiment the memory transistors along adjacent word lines share the same common source 52. The channels of the memory transistors along a given word line are formed in a common silicon island that corresponds to the remaining portions of the silicon film 22, and are separated from each other by P+ regions 30, as shown in FIG. 13. The common silicon island includes a substrate region 36 that is also P+. At least one source contact 60 is provided. Word contacts 62, and 64, are connected to their respective top electrodes 44. The substrate region 36 has a substrate contact 48, while each drain has a bit contact 46.

The present MFIS ferroelectric memory array structure is capable of being block erased to a high threshold voltage. In an embodiment of the present method, the programming voltage $V_P$ will be between approximately 3 V and 5 volts. To accomplish a block erase, a negative programming voltage is applied to a word line, for example by applying the negative programming voltage to word contact 62, while holding all the bits in contact with the word line, the source and the substrate at the ground potential. The negative programming voltage $-V_P$ is in the range of between approximately −3V and −5V. The erased block may be one word up to the entire memory array. Since the word line potential is negative with respect to the source, drain and substrate of each transistor channel, the channel is at the accumulation condition. Holes are accumulated at the surface of the channel of each transistor along the word line. Since the channel of each bit is connected together through the adjacent P+ isolation layer in the given work line, the channels of the transistors are kept at the same potential as that of the substrate region 36, which is at the ground potential in this example. The potential difference between the gate and the channel of the ferroelectric transistors connected to a given word line is at the same potential $-V_P$. The ferroelectric capacitors of these transistors pull positive charge to the top of each ferroelectric gate 42. All the transistors within the selected word are now programmed to a high threshold voltage.

Individual transistors can be selected and programmed to a low threshold voltage. The substrate lines are grounded. All unselected bit lines, unselected word lines and all the sources are biased at x times of the programming voltage, $+V_P$. Where x is from 0.2 to 0.7. To selectively program a given bit, for example B12, which corresponds to the transistor at the intersection of word line (W1) and bit line (B2), to low threshold voltage the word line (W1) is pulsed to $+V_P$, while the bit line (B2) voltage is set to ground. The memory transistor corresponding the B12 is turned on. The voltage across the gate to channel of all un-selected memory transistor is no higher than $(1-x)V_P$. Therefore, their threshold voltage is not affected by this programming operation. Multiple bits in the given word may be programmed to the low threshold voltage at the same time. Therefore it is possible to perform programming on a word basis.

Although the gate voltage of all the other transistors along W1 is at $+V_P$, the substrate is at ground potential while their source voltages and drain voltages are maintained at $xV_P$. The channel of these unselected transistors is depleted. The voltage difference between the gate and channel of these unselected transistors is much lower than the $V_P$. Therefore, the threshold voltage of these unselected transistors is not altered by the selective programming operation.

As to the transistors that share the same bit line as the selected bit, their bit lines and word lines voltage is $(1-x)V_P$, so they are off and their channels are depleted. Therefore, the threshold of these unselected transistors is not affected by the selective programming operation.

The terms of relative position, such as overlying, underlying, beneath are for ease of description only with reference to the orientation of the provided figures, as the actual orientation during, and subsequent to, processing is purely arbitrary.

Although embodiments, including certain preferred embodiments, have been discussed above, the coverage is not limited to any specific embodiment. Rather, the claims shall determine the scope of the invention.

What is claimed is:

1. An MFIS memory array comprising:
   a first MFIS transistor having a first source, a first drain, and a first channel formed over an SOI substrate;
   a second MFIS transistor having a second source, a second drain, and a second channel formed over the SOI substrate;
   a word line connecting the first channel to the second channel;
   a first P+ region interposed between the first channel and the second channel; and
   a P+ substrate region connected to the second channel through a second P+ region.

2. The MFIS memory array of claim 1, wherein the first source and the second source form a common source.

3. The MFIS memory array of claim 1, wherein the first MFIS transistor further comprises a ferroelectric gate material selected from the group consisting of PGO, PZT, SBT, SBO, SBTO, SBTN, STO, SBO, BLT, LNO or YMnO$_3$.

4. The MFIS memory array of claim 1, wherein the word line is Ir or Pt.

5. The MFIS memory array of claim 2, further comprising a third MFIS transistor having a third source and a third channel; and a fourth MFIS transistor having a fourth source and a fourth channel; wherein a second word line connects the third channel to the fourth channel and the third source and the fourth source also form the common source with the first source and the second source.

* * * * *